(12) United States Patent
Cavasin et al.

(10) Patent No.: US 9,780,067 B2
(45) Date of Patent: Oct. 3, 2017

(54) SEMICONDUCTOR CHIP METAL ALLOY THERMAL INTERFACE MATERIAL

(71) Applicants: Daniel Cavasin, Austin, TX (US); Kaushik Mysore Srinivasa Setty, Austin, TX (US)

(72) Inventors: Daniel Cavasin, Austin, TX (US); Kaushik Mysore Srinivasa Setty, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 19 days.

(21) Appl. No.: 14/731,209

(22) Filed: Jun. 4, 2015

(65) Prior Publication Data

US 2016/0358884 A1    Dec. 8, 2016

(51) Int. Cl.
| | |
|---|---|
| *H01L 23/12* | (2006.01) |
| *H01L 23/00* | (2006.01) |
| *B23K 1/00* | (2006.01) |
| *B23K 35/02* | (2006.01) |
| *H01L 23/373* | (2006.01) |
| *H01L 23/367* | (2006.01) |

(52) U.S. Cl.
CPC ............ *H01L 24/83* (2013.01); *B23K 1/0016* (2013.01); *B23K 35/0233* (2013.01); *B23K 35/0244* (2013.01); *H01L 23/3736* (2013.01); *H01L 24/27* (2013.01); *H01L 24/32* (2013.01); *H01L 23/3675* (2013.01); *H01L 2224/27442* (2013.01); *H01L 2224/32225* (2013.01); *H01L 2224/8384* (2013.01); *H01L 2224/83191* (2013.01); *H01L 2224/83192* (2013.01); *H01L 2224/83801* (2013.01)

(58) Field of Classification Search
CPC ............... H01L 23/053; H01L 23/3675; H01L 23/49833; H01L 23/49838; H01L 24/27; H01L 24/32; B23K 1/0016; B23K 35/0233; B23K 35/0244
USPC .......................... 257/704, 706, 707, 712, 713
See application file for complete search history.

(56) References Cited

U.S. PATENT DOCUMENTS

| | | | |
|---|---|---|---|
| 8,221,518 B2 * | 7/2012 | Shearer ................. | B22F 1/0003 228/248.1 |
| 8,497,162 B1 | 7/2013 | Too et al. | |
| 2008/0124840 A1 | 5/2008 | Su | |
| 2014/0175644 A1 * | 6/2014 | Srinivasan .............. | H01L 24/81 257/738 |

OTHER PUBLICATIONS

Duran; *Material Science—Multi-Component Systems*; pp. 111-141.
Duran; *Material Science—Phase Transformations*; pp. 189-198.
Duran; *Material Science—Diffusion in Solids*; pp. 199-222.
John A. Schey; *Introduction to Manufacturing Processes*; 1977; pp. 214-220.
German et al; *Review: liquid phase sintering*; J Mater Sci vol. 44; Dec. 11, 2008; pp. 1-39.

* cited by examiner

*Primary Examiner* — Hung Vu
(74) *Attorney, Agent, or Firm* — Timothy M. Honeycutt

(57) ABSTRACT

Various apparatus and methods are disclosed. In one aspect, a method of manufacturing a thermal interface material on a semiconductor chip is provided. The method includes placing a preform of a combination of a first metal and a second metal on one of the semiconductor chip or a lid. The preform is liquid phase sintered to cause the combination to evolve to an equilibrium composition and bond to the semiconductor chip.

20 Claims, 7 Drawing Sheets

SEMICONDUCTOR CHIP METAL ALLOY THERMAL INTERFACE MATERIAL

BACKGROUND OF THE INVENTION

1. Field of the Invention

This invention relates generally to semiconductor processing, and more particularly to semiconductor chip thermal interface materials and methods of making the same.

2. Description of the Related Art

Many current integrated circuits are formed as multiple chips or dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. To interface electrically with another circuit board or device, the package substrate is typically fabricated with an input/output (I/O) system. Socket suitable examples include pin grid arrays and land grid arrays. Surface mount examples include solder ball grid arrays.

Some conventional integrated circuits, such as microprocessors, generate sizeable quantities of heat that must be transferred away to avoid device shutdown or damage. The lid serves as both a protective cover and a heat transfer pathway. To provide a heat transfer pathway from the integrated circuit to the lid, a thermal interface material (TIM) is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. Organic thermal interface materials generally do not provide the high thermal conductivities required for large die, high thermal design power package applications. Organic TIM materials also have present challenges with meeting moisture sensitivity and multiple reflow reliability requirements. More recently, designers have begun to turn to solder materials as a thermal interface material, particularly for high power-high temperature chips.

A solder thermal interface material like indium has favorable thermal properties that work well for high power-high temperature die. However, indium presents design challenges. First, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces. Second, indium has a low melting point compared to solders used in electronic manufacturing. A typical conventional package substrate must be heated well above the melting point of indium in order to reflow a package ball grid array during surface mounting. The indium thermal interface material might degrade in various ways such as temporary liquification. Thus, indium is unsuitable for surface mount package applications.

Alternatives to indium for surface mount packages have remained elusive. The main reason is that there is has not been a combination of a manufacturable attachment method in assembly, and a thermal interface that will survive multiple reflow events. Some known potential alternatives to indium might be any number of typical solder alloys currently used in electronics manufacturing. These materials can exhibit a wide range of melting points, between 183° C. for eutectic Pb—Sn and 280° C. for Au—Sn. Application of such materials as TIMs would require thermal processing that is typically a minimum of 20 to 30° C. higher than their liquidus points. Once a lid is attached using any of these materials as TIMs, any subsequent thermal processing that exceeds their liquidus points will cause them to reflow. Any reflow that occurs subsequent to the initial attachment of the lid will lead to the same degradation of the thermal interface material due to solder movement, dewetting, and void formation in the liquid state.

The present invention is directed to overcoming or reducing the effects of one or more of the foregoing disadvantages.

SUMMARY OF EMBODIMENTS OF THE INVENTION

In accordance with one aspect of the present invention, a method of manufacturing a thermal interface material on a semiconductor chip is provided. The method includes placing a preform of a combination of a first metal and a second metal on one of the semiconductor chip or a lid. The preform is liquid phase sintered to cause the combination to evolve to an equilibrium composition and bond to the semiconductor chip.

In accordance with another aspect of the present invention, a method of manufacturing is provided that includes placing a semiconductor chip on a circuit board and placing a preform of a combination of a first metal and a second metal on one of the semiconductor chip or a lid. The preform is liquid phase sintered to cause the combination to evolve to an equilibrium composition and bond to the semiconductor chip.

In accordance with another aspect of the present invention, an apparatus is provided that includes a semiconductor chip and a thermal interface material on the semiconductor chip. The thermal interface material includes an alloy of a first metal and a second metal at an equilibrium phase. The alloy liquid is phase sintered to the equilibrium composition and thereby bonded to the semiconductor chip.

In accordance with another aspect of the present invention, an apparatus is provided that includes a semiconductor chip and thermal interface material on the semiconductor chip. The thermal interface material is an alloy of a first metal and a second metal at an equilibrium phase with a first melting point.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

An alloy thermal interface material may be used to metallurgically bond a packaged semiconductor chip to a lid or heat spreader. Liquid phase sintering may be used to evolve a thermal interface material alloy toward an equilibrium state with a melting point well above typical temperatures associated with post chip mount processing, such as solder interconnect reflows. In this way, the benefits of the high thermal conductivities provided by a metallic thermal interface materials may be realized without jeopardizing thermal interface material integrity. Additional details will now be described.

Figure 1:
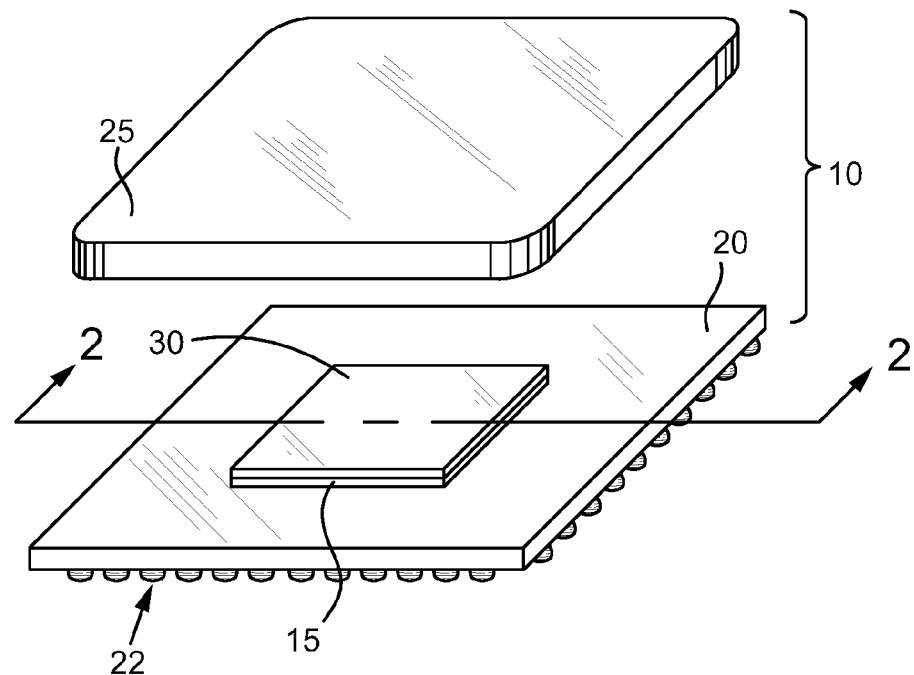
FIG. 1 is a partially exploded pictorial view of an exemplary semiconductor chip device.
Figure 2:
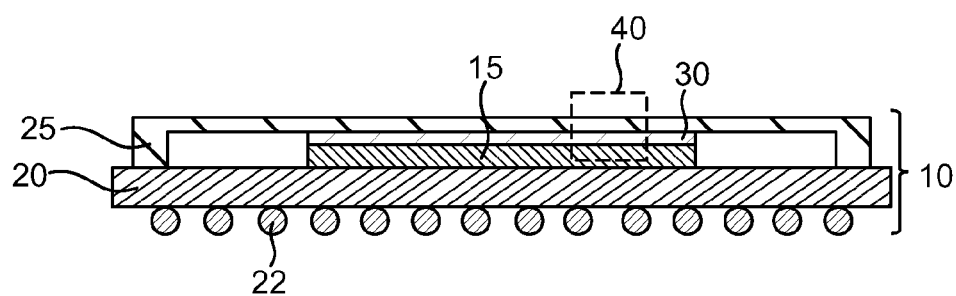
FIG. 2 is a sectional view of FIG. 1 taken at section 2-2.

In the drawings described below, reference numerals are generally repeated where identical elements appear in more than one figure. Turning now to the drawings, and in particular to FIGS. 1 and 2, therein is shown a partially exploded pictorial view and a sectional view of FIG. 1 taken at section 2-2, respectively, of an exemplary embodiment of a semiconductor chip device 10 that includes a semiconductor chip 15 mounted on a circuit board 20. The semiconductor chip may be any of a myriad of different types of circuit devices used in electronics. A non-exhaustive list of examples includes microprocessors, graphics processors, combined microprocessor/graphics processors, system-on-chips, application specific integrated circuits, memory devices or the like. The semiconductor chip may be single or multi-core or even stacked with additional dice. The semiconductor chip 15 may be constructed of bulk semiconductor, such as silicon or germanium, or semiconductor on insulator materials, such as silicon-on-insulator materials or other materials suitable to construct an integrated circuit.

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chip 15 and another device, such as another circuit board for example. To interface electrically with other devices, such as another circuit board or other electronic device (not shown), the circuit board 20 may be provided with plural input/outputs (I/Os) 22. Here the I/Os 22 may be in the form of a ball grid array of solder balls. However, the skilled artisan will appreciate that pin grid arrays, land grid arrays or other types of I/O structures may be used as desired.

A lid 25 may be placed over the semiconductor chip 15 and in thermal contact therewith by way of a thermal interface material 30. The lid 25 serves as a heat spreader to transfer heat away from the semiconductor chip 15. The lid 25 may be a bath tub design as depicted, a top hat design or some other configuration as desired. The lid 25 may be composed of well-known ceramics or metallic materials as desired. Some exemplary materials include copper, nickel plated copper, stainless steel, anodized aluminum, aluminum-silicon-carbon, aluminum nitride, boron nitride, diamond or the like. The lid 25 may be secured to the circuit board 20 by an adhesive (not visible) composed of a well-known thixotropic adhesive, an epoxy, another type of polymer or even a solder.

Figure 3:
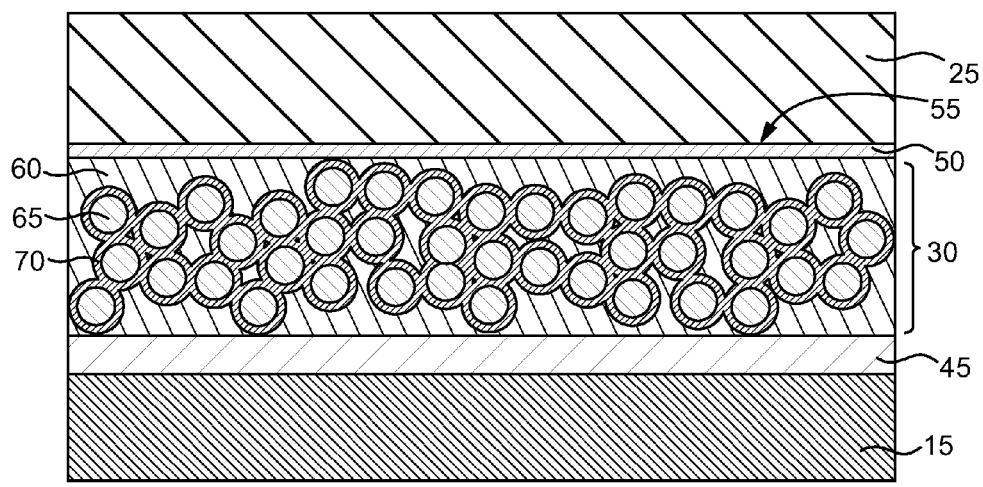
FIG. 3 is a portion of FIG. 2 shown at greater magnification.

Note the location of the dashed rectangle 40 in FIG. 2. The portion of the FIG. 2 circumscribed by the dashed rectangle 40 will be shown at greater magnification in FIG. 3. Attention is now turned to FIG. 3. Because of the location of the dashed rectangle 40 in FIG. 2, FIG. 3 depicts a small portion of the semiconductor chip 15, a small portion of the lid 25 and a small portion of the thermal interface material 30. Depending upon the ability of the thermal interface material 30 to bond suitably with the semiconductor chip 15, the semiconductor chip 15 may be provided with an optional backside metallization (BSM) layer or stack 45. The BSM 45 may be a unitary metallic structure or a laminate of plural metal layers. Many materials may be used for the BSM 45. In an exemplary embodiment, the BSM 45 may consist of an aluminum film formed on the semiconductor chip 15, a titanium film formed on the aluminum film, a nickel-vanadium film formed on the titanium film and a gold film formed on the nickel-vanadium film. The aluminum film provides advantage adhesion with silicon. The titanium film provides a barrier layer to prevent gold from migrating into the semiconductor chip 15, the nickel-vanadium film provides desirable adhesion with gold and the gold film provides a desirable wetting surface for the thermal interface material 30. The selection appropriate materials for the BSM 45 will depend on the composition of the semiconductor chip 15 and the thermal interface material 30.

Depending upon the composition of the lid 25, an optional wetting layer 50 may be provided at an inner surface 55 of the lid 25 to facilitate metallurgical bonding with the thermal interface material 30. The composition of the wetting film 50 may be tailored to advantageously provide favorable wetting of the thermal interface material 30. Exemplary materials include, for example, gold, platinum, palladium or the like.

The thermal interface material 30 is advantageously composed of an alloy of two or more metals that has undergone liquid phase sintering. The thermal interface material 30 is a solid solution consisting of a solvent 60 in which multiple phases are present. For example, the round circles 65 represent solute granules and the jackets or coatings 70 around the circles 65 may consist of various phases or intermetallic compounds. The thermal interface material 30 is not static over time but rather the intermetallic compounds 70 evolve depending upon temperature and time. The objective is to create by way of liquid phase sintering an alloy of two or more metals for the thermal interface material 30 that has evolved to an equilibrium phase that has a melting point that is well above the temperature peak that the semiconductor chip device 10 is anticipated to encounter during subsequent processing and/or electrical operation. Various alloys may be used. Design considerations for alloys include compatibility with various lid 25 lid materials, various chip 15 backside materials, compatibility with preform fabrication, i.e., powder or sheet construction of preforms and liquid phase sintering suitability. A Sn-38Cu powder mixture will be used to describe an exemplary process below. Thus, the solvent 60 may be tin, the solute granules 65 may be copper and the intermetallic compounds or phases 70 may be one or more phases $Cu_xSn_y$.

Figure 4:
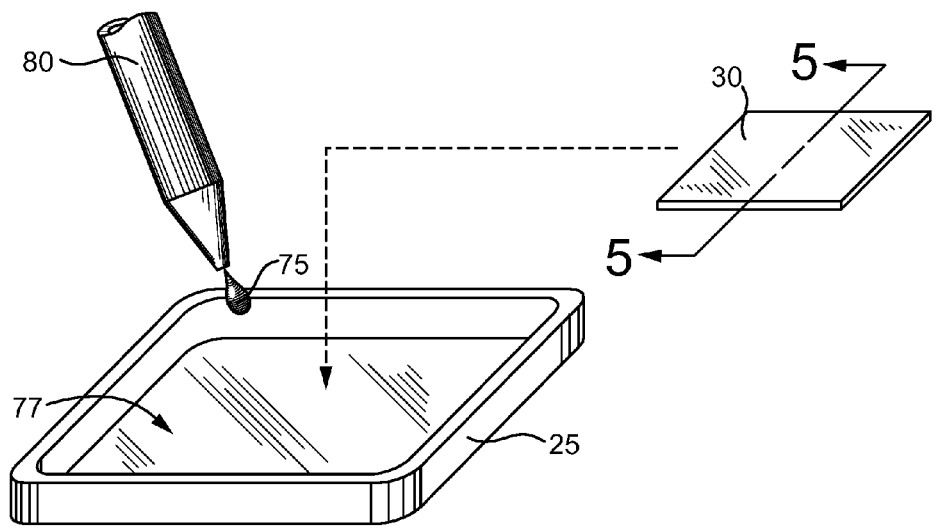
FIG. 4 is an exploded pictorial view depicting an exemplary thermal interface material placement on an exemplary lid.
Figure 5:
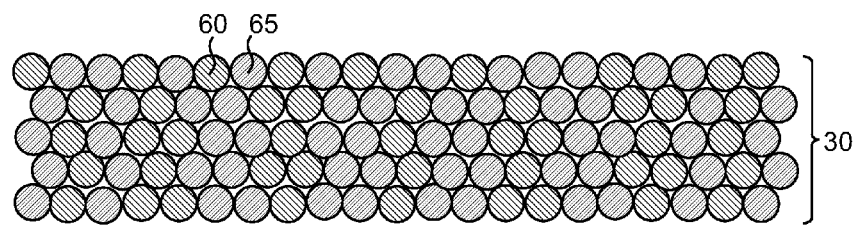
FIG. 5 is a sectional view of the thermal interface material preform of FIG. 4 taken at section 5-5.
Figure 6:
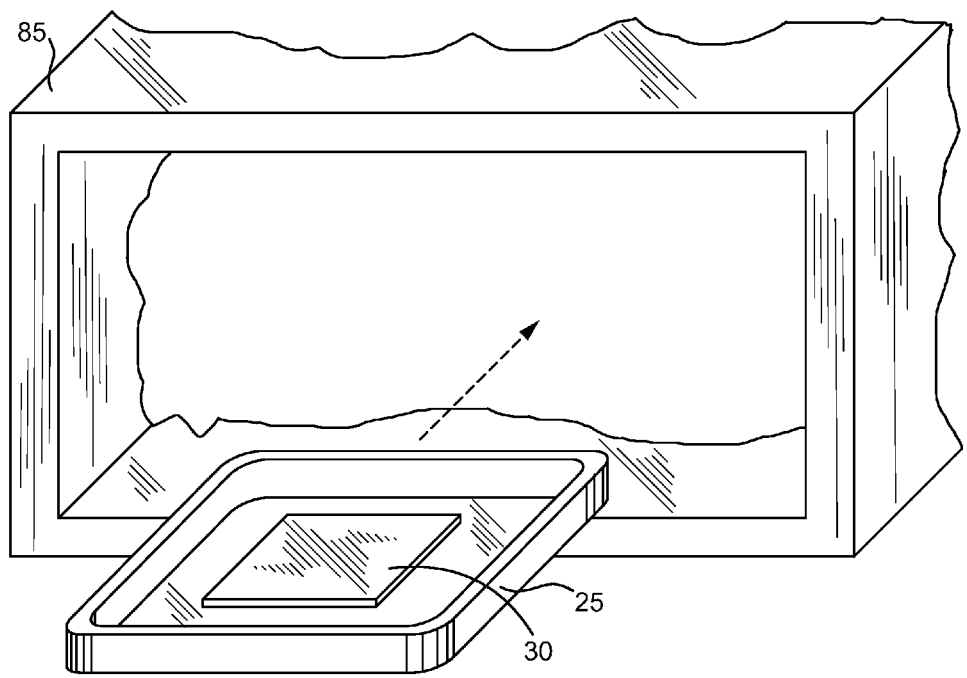
FIG. 6 is a pictorial view depicting exemplary placement of the lid and thermal interface preform in an oven.

The fabrication of the thermal interface material 30 may be understood by referring now to FIGS. 4 and 5. FIG. 4 is a pictorial view of the lid 25 flipped over from the orientation depicted in FIG. 1 and the thermal interface material 30 exploded from the lid 25 and FIG. 5 is a blown up sectional view of the thermal interface material 30 taken at section 5-5. The thermal interface material 30 of the stated alloy composition is pressed into a preform using standard powder metallurgy techniques, in dimensions corresponding to the target die size. In this green state, the thermal interface material preform 30 consists of pure Sn granules 60 and pure Cu granules 65 that have been pressed into intimate contact at room temperature. As shown in FIG. 4, the thermal interface material 30 preform in a green state may be applied to the lid 25 and soldering may be used to bond the thermal interface material 30 preform to the lid 25. This placement step may be preceded by the application of a suitable flux 75 to an inner surface 77 of the lid 25 using some form of well-known applicator 80. After the application of the flux 75, the thermal interface material preform 30 may be placed on the lid 25 and the combination of the lid 25 and the thermal interface material 30 preform may be placed into a suitable oven 85 as shown in FIG. 6 and a reflow preformed in a temperature range of about 240 to 260° C. This temperature exposure will cause the Sn particles 60 to reflow, as the Sn liquidus temperature is 232° C. As the Sn 60 reflows, it provides a metallurgical bond between the thermal interface material 30 preform and the lid 25. In parallel, the Cu particles 65 in contact with the liquefied Sn particles 60 begin to rapidly diffuse, which begins the process of microstructure evolution to the equilibrium phase of the alloy.

Figure 7:
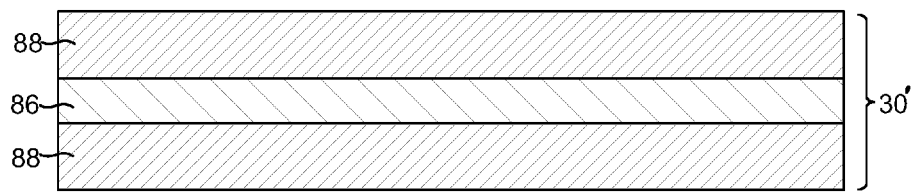
FIG. 7 is a sectional view like FIG. 5 but depicting an alternate exemplary thermal interface material preform.

The skilled artisan will appreciate that other structures may be used to create an alloy at or approaching equilibrium phases with the desired melting point. For example, FIG. 7 depicts a sectional view of an alternate thermal interface material 30' that consists of a stack of metal sheets 86 and 88. The sheets 86 and 88 may number more than three and be stacked in various orders. Again using a Sn-38Cu example, the sheet 86 may be composed of copper and the sheets 88 composed of tin. In another embodiment, the sheets 86 and 88 may be Sn—Cu solder sheets. The thermal interface material 30' preform may be attached to the lid 25 shown in FIG. 4 using the soldering techniques described above.

Figure 8:
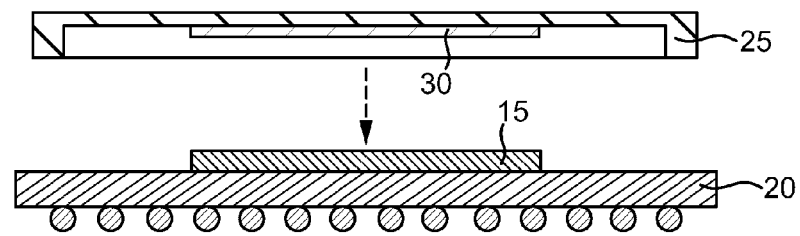
FIG. 8 is a sectional view like FIG. 2, but depicting exemplary placement of a lid and thermal interface material on a semiconductor chip and circuit board.
Figure 9:
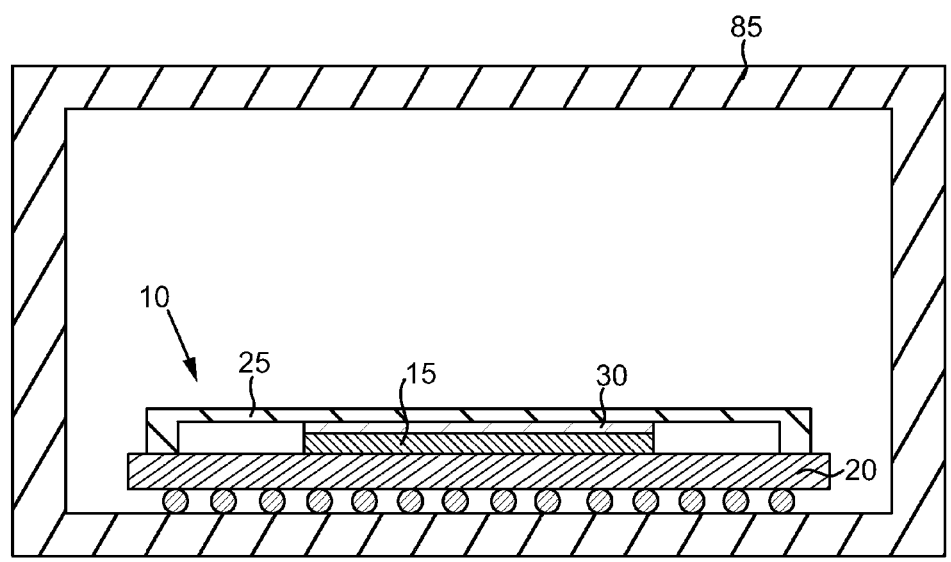
FIG. 9 is a sectional view depicting the semiconductor chip device in an oven for reflow and liquid phase sintering processing.
Figure 10:
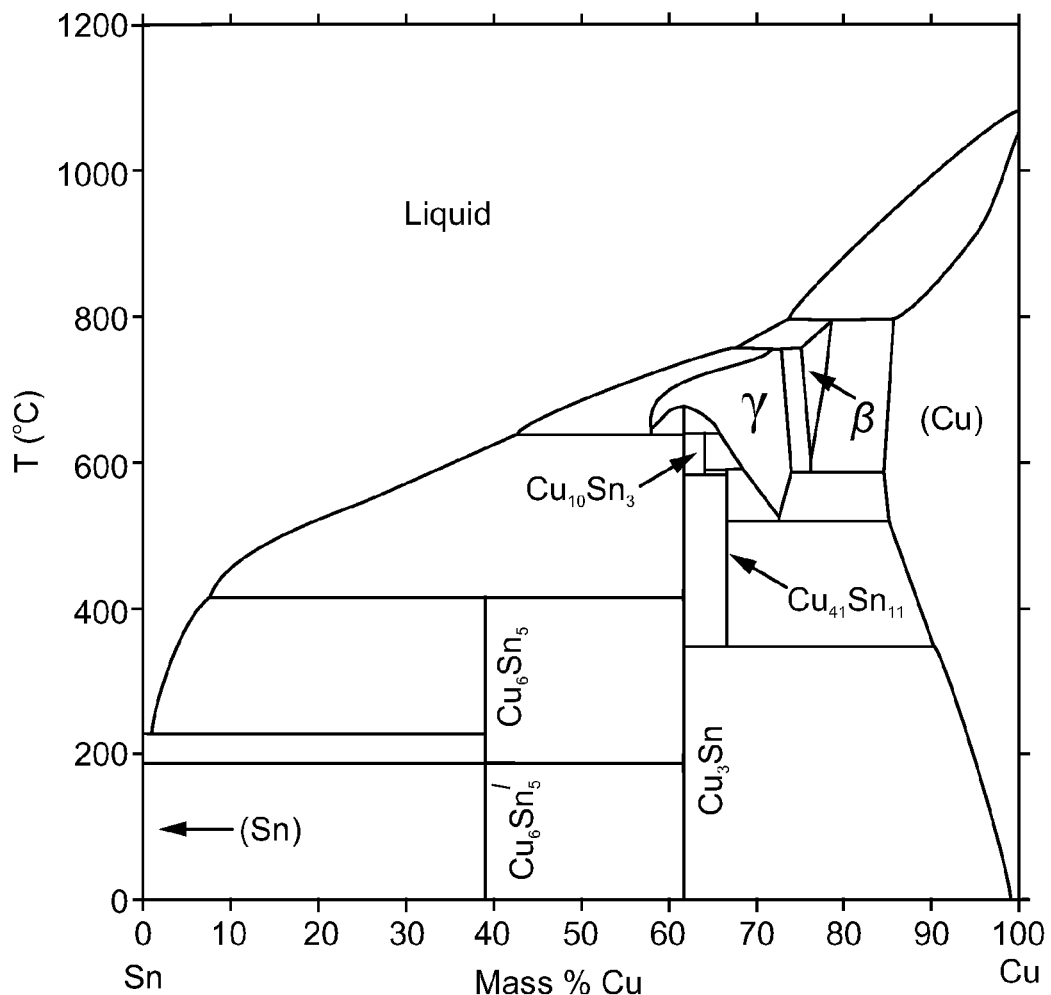
FIG. 10 is a phase equilibrium diagram for an exemplary thermal interface material solder.

Following the reflow to establish a metallurgical bond of the thermal interface material 30 preform to the lid 25 and the initial evolution of the alloy of the thermal interface material 30 from a green state toward the equilibrium state depicted in FIG. 3, the lid 25 and the thermal interface material 30 may be removed from the oven 85 depicted in FIG. 6 and subsequently mounted on the circuit board 20 as shown in FIG. 8. When the lid 25 is mounted on the circuit board 20, the thermal interface material 30 is positioned over the semiconductor chip 15. The thermal interface material 30 may contact or be a tiny distance above the semiconductor chip 15. The combination of the circuit board 20, the semiconductor chip 15, the lid 25 and the thermal interface material 30 (and indeed the entirety of the semiconductor chip device 10) may be placed into the furnace 85 and a second reflow process performed again in the 240 to 260° C. temperature range. During this second reflow, the thermal interface material 30 wets to the semiconductor chip 15, completing the metallurgical bond between the semiconductor chip 15, the thermal interface material 30 and the lid 25. In parallel, the Cu diffusion process continues until the equilibrium phases of the Sn-38Cu alloy are nearly or completely formed. In this state, the melting point of the thermal interface material 30 is now in excess of 400° C., well above the temperature peak that the assembled semiconductor chip device 10 will experience in subsequent processing, whether for reliability qualification, ball attach, board mounting or electrical operation. The behavior of the thermal interface material 30 during the two reflows may be understood in more detail by referring now to FIG. 10, which is a phase equilibrium diagram for a tin copper alloy. In this illustrative embodiment, a Sn-38Cu alloy has a melting point that is slightly above 400° C., which is well above the peak temperature that is anticipated to be encountered by the semiconductor chip device 10 during subsequent processing and/or electrical operation. For example, the 400° C. melting point exceeds the melting point of the solder I/Os 22 shown in FIGS. 1 and 2. Note however that during the reflow processes that involve a liquification of tin and the diffusion of copper therein, there may be multiple different intermetallic compounds or otherwise known as solid solutions of copper and tin as shown. Some of these different types of intermetallics are labeled γ, β, $Cu_6Sn_5$, $Cu_3Sn$ etc. It is evident from FIG. 10 that alloys from about 2 to 3% Cu to about 38% Cu yield a solidus temperature of greater than 260° C. Note also that other solders, such as tin silver, or others could used in this way. The disclosed techniques provide for a thermal interface material and attachment process using standard solder reflow temperatures that yield, via evolution of the bulk material to an equilibrium composition with a melting point much higher than the standard reflow temperatures, resistance to subsequent unwanted reflows. Thus, for example, a lidded ball grid array package which undergoes multiple reflows after initial assembly may be provided with a robust metallic thermal interface material.

Figure 11:
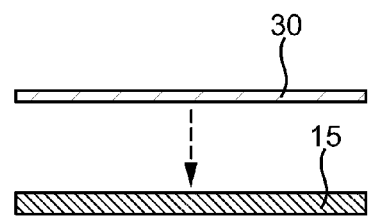
FIG. 11 is a sectional view of an exemplary thermal interface material placement on a chip prior to lid attachment.
Figure 12:
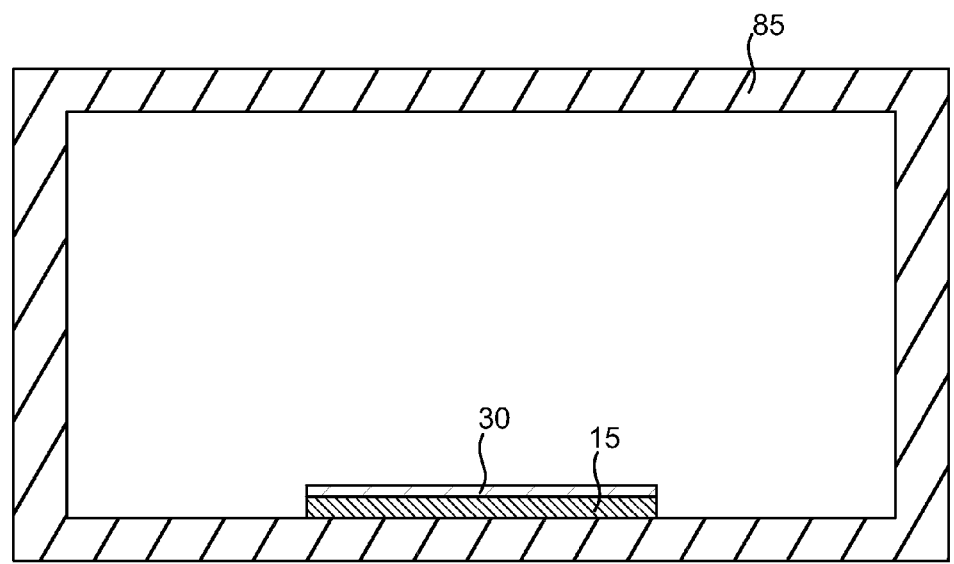
FIG. 12 is a sectional depicting the semiconductor chip in an oven for reflow and liquid phase sintering processing.

In the foregoing illustrative embodiments, the thermal interface material 30 is first applied to the lid 25 and then an initial reflow is established to bond the thermal interface material 30 to the lid 25. However, the skilled artisan will appreciate that the thermal interface material 30 or any disclosed alternatives may be first mounted to the semiconductor chip 15 as shown in FIG. 11. This might be accomplished with or without the aid of an adhesive. This may also be accomplished at a die or wafer level as desired. Following the initial mounting of the thermal interface material 30 to the semiconductor chip 15, a single reflow to establish the thermal interface material 30 in the state depicted in FIG. 3 may be performed, that is, following the mounting of the lid 25 or a two stage reflow wherein the semiconductor chip 15 and thermal interface material 30 combination is subject to initial bonding and solid solution evolution reflow followed by a post lid mounting reflow. For example, following the application of the thermal interface material 30 to the semiconductor chip 15, the combination of the thermal interface material 30 and the chip 15 may be placed in the oven 85 and this initial metallurgical bonding/solid solution evolution reflow may be performed as shown in FIG. 12.

Figure 13:
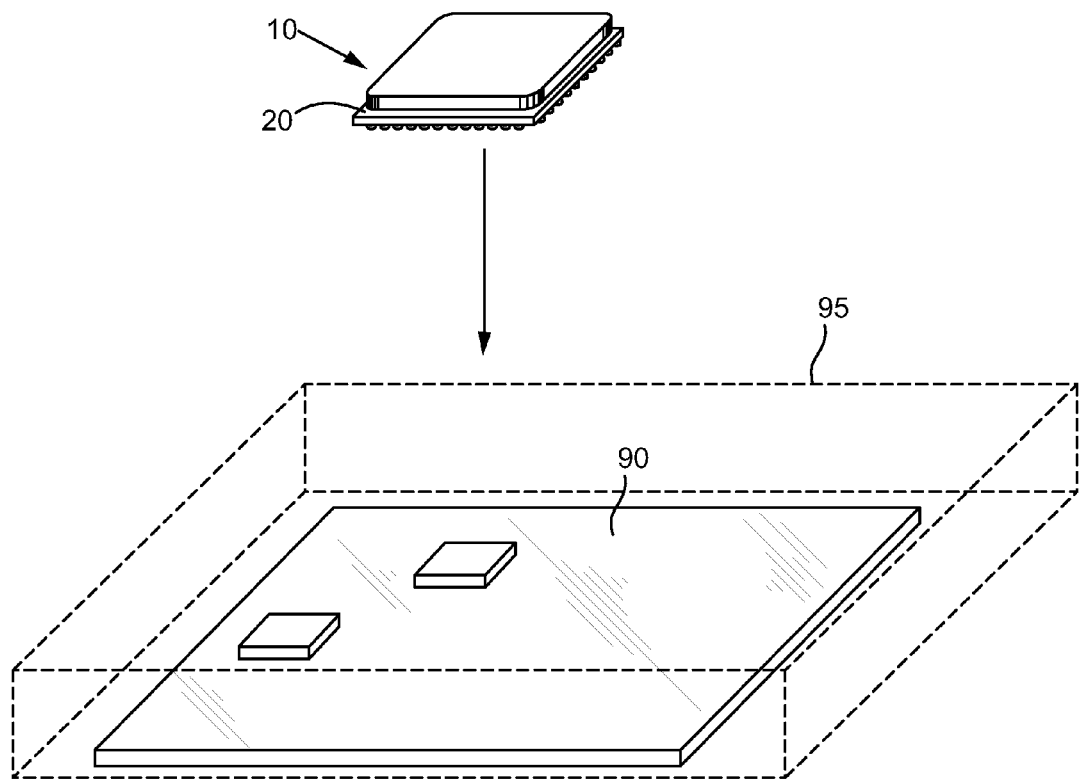
FIG. 13 is a pictorial view of the exemplary semiconductor chip device exploded from an exemplary electronic device and circuit board.

As shown in FIG. 13, the semiconductor chip device 10, including the circuit board 20 thereof, may be mounted on another circuit board 90 or otherwise positioned in an electronic device 95 represented by the dashed box. The electronic device 95 may be a desktop computer, a tablet computer, a handheld device (e.g., a smart phone) or other electronic device.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing a thermal interface material on a semiconductor chip, comprising:
   placing a preform of a combination of a first metal and a second metal on one of the semiconductor chip or a lid; and
   liquid phase sintering the preform to cause the combination to evolve to an equilibrium composition and bond to the semiconductor chip.

2. The method of claim 1, wherein the preform comprises a combination of a first metal powder and a second metal powder.

3. The method of claim 1, wherein the preform comprises a sheet of the first metal and a sheet of the second metal.

4. The method of claim 1, wherein the placement of the preform comprises coupling the preform to the lid and placing the lid over the semiconductor chip.

5. The method of claim 4, wherein the coupling of the preform to the lid comprises soldering.

6. The method of claim 4, comprising placing the semiconductor chip on a circuit board.

7. The method of claim 6, wherein the circuit board includes plural solder I/Os having a first melting point, the liquid phase sintered preform having a second melting point greater than the first melting point.

8. A method of manufacturing, comprising:
   placing a semiconductor chip on a circuit board;
   placing a preform of a combination of a first metal and a second metal on one of the semiconductor chip or a lid; and
   liquid phase sintering the preform to cause the combination to evolve to an equilibrium composition and bond to the semiconductor chip.

9. The method of claim 8, wherein the placement of the preform comprises coupling the preform to the lid and placing the lid over the semiconductor chip.

10. The method of claim 9, wherein the circuit board includes plural solder I/Os having a first melting point, the liquid phase sintered preform having a second melting point greater than the first melting point.

11. The method of claim 8, wherein the circuit board comprises a package substrate.

12. An apparatus, comprising:
    a semiconductor chip; and
    a thermal interface material on a semiconductor chip, the thermal interface material including an alloy of a first metal and a second metal at an equilibrium phase, the alloy liquid phase sintered to the equilibrium composition and thereby bonded to the semiconductor chip.

13. The apparatus of claim 12, comprising a circuit board, the semiconductor chip being positioned on the circuit board.

14. The apparatus of claim 13, comprising a lid positioned on the circuit board and in thermal contact with the thermal interface material.

15. An apparatus, comprising:
    a semiconductor chip; and
    thermal interface material on the semiconductor chip, the thermal interface material being an alloy of a first metal and a second metal at an equilibrium phase with a first melting point.

16. The apparatus of claim of claim 15, comprising a first circuit board, the semiconductor chip being positioned on the first circuit board.

17. The apparatus of claim 16, comprising a lid positioned on the circuit board and in thermal contact with the alloy preform thermal interface material.

18. The apparatus of claim 16, wherein the first circuit board includes plural solder I/Os having a second melting point lower than the first melting point.

19. The apparatus of claim 16, wherein the first circuit board comprises a package substrate.

20. The apparatus of claim 16, comprising a second circuit board, the first circuit board being mounted on the second circuit board.

* * * * *